US012791619B2

(12) United States Patent
Chen

(10) Patent No.: US 12,791,619 B2
(45) Date of Patent: Nov. 10, 2026

(54) METHOD AND APPARATUS FOR MONITORING PARAMETER OF BATTERY PACK, AND STORAGE MEDIUM

(71) Applicant: JIANGSU ZENERGY BATTERY TECHNOLOGIES GROUP CO., LTD., Jiangsu (CN)

(72) Inventor: Shenglin Chen, Jiangsu (CN)

(73) Assignee: JIANGSU ZENERGY BATTERY TECHNOLOGIES GROUP CO., LTD., Changshu Suzhou (CN)

( * ) Notice: Subject to any disclaimer, the term of this patent is extended or adjusted under 35 U.S.C. 154(b) by 455 days.

(21) Appl. No.: 18/374,660

(22) Filed: Sep. 28, 2023

(65) Prior Publication Data

US 2024/0118347 A1 Apr. 11, 2024

(30) Foreign Application Priority Data

Oct. 9, 2022 (CN) ......................... 202211224006.8

(51) Int. Cl.
*G01R 31/389* (2019.01)
*G01R 31/36* (2020.01)
(Continued)

(52) U.S. Cl.
CPC ............ *G01R 31/389* (2019.01); *G01R 31/36* (2013.01); *G01R 31/367* (2019.01);
(Continued)

(58) Field of Classification Search
USPC ........................................................... 702/63
See application file for complete search history.

(56) References Cited

U.S. PATENT DOCUMENTS

2011/0301891 A1* 12/2011 Kim ..................... G01R 31/392 702/63
2017/0234934 A1* 8/2017 Zhong ................ G01R 31/3835 702/63
(Continued)

FOREIGN PATENT DOCUMENTS

CN 102680795 A 9/2012
CN 106501736 A 3/2017
(Continued)

OTHER PUBLICATIONS

Radu Gogoana; et al. "Internal resistance matching for parallel-connected lithium-ion cells and impacts on battery pack cycle life". Journal of Power Sources. Dec. 31, 2014. Dec. 31, 2014. p. 8-13.
(Continued)

*Primary Examiner* — Paul D Lee
(74) *Attorney, Agent, or Firm* — The Sun IP Law

(57) ABSTRACT

The present disclosure provides a method and apparatus for monitoring a parameter of a battery pack, and a storage medium. The method comprises: acquiring a first pre-estimated resistance value corresponding to the battery pack at a t-th cycle based on a preset state estimation equation and an internal resistance value of the battery pack at a (t−1)-th cycle, wherein the current number of cycles represents the number of charges and discharges cumulatively completed by the battery pack, and the preset state estimation equation represents a conversion relationship between the internal resistance value at the (t−1)-th cycle and the first pre-estimated resistance value; determining a second pre-estimated resistance value corresponding to the t-th cycle based on a pre-configured mapping relationship; and determining an internal resistance value of the battery pack at the t-th cycle based on the first pre-estimated resistance value and the second pre-estimated resistance value.

16 Claims, 5 Drawing Sheets

(51) Int. Cl.

| | |
|---|---|
| *G01R 31/367* | (2019.01) |
| *G01R 31/392* | (2019.01) |
| *G06F 17/11* | (2006.01) |
| *H01M 10/42* | (2006.01) |

(52) U.S. Cl.

CPC ............ *G01R 31/392* (2019.01); *G06F 17/11* (2013.01); *H01M 10/42* (2013.01)

(56) References Cited

U.S. PATENT DOCUMENTS

| | | | | |
|---|---|---|---|---|
| 2017/0370995 | A1* | 12/2017 | Huang ................. | G01R 31/396 |
| 2019/0064276 | A1* | 2/2019 | Kawai .................. | G01R 31/367 |

FOREIGN PATENT DOCUMENTS

| | | | |
|---|---|---|---|
| CN | 107064815 | A | 8/2017 |
| CN | 108459278 | A | 8/2018 |
| CN | 111581904 | A | 8/2020 |
| CN | 112946499 | A | 6/2021 |
| CN | 112986841 | A | 6/2021 |
| CN | 114325399 | A | 4/2022 |
| CN | 114690039 | A | 7/2022 |
| CN | 115032556 | A | 9/2022 |
| CN | 115097309 | A | 9/2022 |
| JP | 2013152184 | A | 8/2013 |
| JP | 2022017505 | A | 1/2022 |
| WO | 2022006694 | A1 | 1/2022 |

OTHER PUBLICATIONS

Liang Qi, et al. "Study on the internal resistance of aviation lithium cobalt oxide battery based on PNGV circuit model" Journal of Power Sources, No. 02. Mar. 15, 2017. Mar. 15, 2017.

* cited by examiner

METHOD AND APPARATUS FOR MONITORING PARAMETER OF BATTERY PACK, AND STORAGE MEDIUM

This application claims priority to Chinese Patent Application No. CN202211224006.8 filed with China National Intellectual Property Administration on Oct. 9, 2022, the entirety of which is herein incorporated by reference.

TECHNICAL FIELD

The present disclosure relates to the field of batteries, and in particular, to a method and apparatus for monitoring a parameter of a battery pack, and a storage medium.

BACKGROUND

Under dual pressure of environmental pollution and energy crisis, due to great potential on energy conservation and emission reduction, hybrid electric vehicles, pure electric vehicles and fuel cell vehicles are increasingly accepted. Among these types of electric vehicles, pure electric vehicles are considered to be one of the most promising solutions in the future. A power battery is a unique power source of the pure electric vehicles. For comprehensive consideration of speed, efficiency, endurance mileage, service life, safety and costs of vehicles, currently, most pure electric vehicles use a lithium ion battery as an energy source.

However, lithium ion batteries have certain potential safety problems, which pose a threat to the personal safety and property safety of consumers. An internal resistance of the lithium battery is one of the most important parameters of the lithium battery. The change of the internal resistance is closely related to the performance and safety of the battery. An internal short-circuit is one trigger form of battery abuse, and is also one of the most common causes in thermal runaway accidents of lithium ion batteries. Therefore, it is particularly important to be capable of precisely calculating an internal resistance and an internal short-circuit resistance.

SUMMARY

Embodiments of the present disclosure provide a method and apparatus for monitoring a parameter of a battery pack, and a storage medium, which may at least partially alleviate the described problem.

The embodiments of the present disclosure adopt the following technical solutions.

According to a first aspect, the embodiments of the present disclosure provide a method for monitoring a parameter of a battery pack, the method comprising:

- acquiring a first pre-estimated resistance value corresponding to the battery pack at a t-th cycle based on a preset state estimation equation and an internal resistance value of the battery pack at a (t−1)-th cycle,
- wherein t represents the current number of cycles of the battery pack, the current number of cycles represents the number of charges and discharges cumulatively completed by the battery pack, and the preset state estimation equation represents a conversion relationship between the internal resistance value at the (t−1)-th cycle and the first pre-estimated resistance value, where t≥2;
- determining a second pre-estimated resistance value corresponding to the t-th cycle based on a pre-configured mapping relationship, wherein the pre-configured mapping relationship represents a conversion relationship between t and the second pre-estimated resistance value; and
- determining an internal resistance value of the battery pack at the t-th cycle based on the first pre-estimated resistance value and the second pre-estimated resistance value.

According to a second aspect, the embodiments of the present disclosure provide an apparatus for monitoring a parameter of a battery pack, the apparatus comprising:

- a processing unit, configured to acquire a first pre-estimated resistance value corresponding to the battery pack at a t-th cycle based on a preset state estimation equation and an internal resistance value of the battery pack at a (t−1)-th cycle,
- wherein t represents the current number of cycles of the battery pack, the current number of cycles represents the number of charges and discharges cumulatively completed by the battery pack, and the preset state estimation equation represents a conversion relationship between the internal resistance value at the (t−1)-th cycle and the first pre-estimated resistance value, where t≥2;
- the processing unit is further configured to determine a second pre-estimated resistance value corresponding to the t-th cycle based on a pre-configured mapping relationship, wherein the pre-configured mapping relationship represents a conversion relationship between t and the second pre-estimated resistance value; and
- a calculation unit, configured to determine an internal resistance value of the battery pack at the t-th cycle based on the first pre-estimated resistance value and the second pre-estimated resistance value.

According to a third aspect, the embodiments of the present disclosure provide a storage medium having a computer program stored thereon; wherein when the computer program is executed by the processor, the described method is implemented.

According to a fourth aspect, the embodiments of the present disclosure provide an electronic device, the electronic device comprising: a processor and a memory, wherein the memory is used for storing one or more programs, and the one or more programs, when being executed by the processor, cause the processor to execute the described method.

With respect to the related art, the embodiments of the present disclosure provide a method and apparatus for monitoring a parameter of a battery pack, and a storage medium. Correction and optimization are performed based on combination of the first pre-estimated resistance value and the second pre-estimated resistance value so as to obtain an internal resistance value of the battery pack at the t-th cycle, thereby ensuring the accuracy of the finally obtained internal resistance value of the battery pack at the t-th cycle, so that the current state of the battery pack can be more clearly learned.

In order to make the described features and advantages of the present disclosure more apparent and easily understood, hereinafter, exemplary embodiments will be exemplified and described in detail below in conjunction with the accompanying drawings.

BRIEF DESCRIPTION OF THE DRAWINGS

In order to illustrate technical solutions of the embodiments of the present disclosure more clearly, hereinafter, accompanying drawings requiring to be used in the embodiments will be briefly introduced. It should be understood that the following accompanying drawings only illustrate certain embodiments of the present disclosure, and therefore shall not be considered as limiting the scope. For a person having ordinary skill in the art, other related accompanying drawings may also be obtained according to these accompany drawings without any inventive effort.

Figure 1:
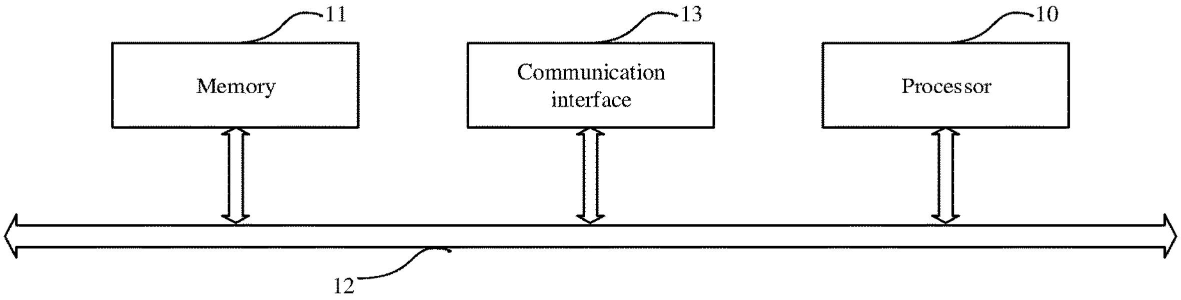
FIG. 1 is a schematic structural diagram of an electronic device provided according to the embodiments of the present disclosure.

In the figures: 10—Processor; 11—Memory; 12—Bus; 13—Communication interface; 201—Processing unit; and 202—Calculation unit.

DETAILED DESCRIPTION

In order to make technical solutions and advantages of the embodiments of the present disclosure clearer, hereinafter, the technical solutions in the embodiments of the present disclosure will be clearly and completely described with reference to the accompanying drawings in the embodiments of the present disclosure. Obviously, the embodiments as described are only some rather than all the embodiments of the present disclosure. Generally, assemblies of embodiments of the present disclosure as described and illustrated in the accompanying drawings herein may be arranged and designed in various different configurations.

Therefore, the following detailed description of the embodiments of the present disclosure provided in the accompanying drawings is not intended to limit the claimed scope of the present disclosure, but merely represent exemplary embodiments of the present disclosure. Based on the embodiments in the present disclosure, all other embodiments obtained by a person having ordinary skill in the art without any inventive effort shall all belong to the scope of protection of the present disclosure.

It should be noted that similar numerals and letters represent similar items in the following accompanying drawings, and thus once a certain item is defined in one accompanying drawing, this item will not be further defined and explained in subsequent accompanying drawings. Moreover, in the description of the present disclosure, the terms "first", "second", etc. are only used for distinguishing the description, and cannot be understood as indicating or implying relative importance.

It should be noted that in the present text, relational terms such as first and second, etc. are only used to distinguish one entity or operation from another entity or operation, and do not necessarily require or imply any actual relationship or sequence between these entities or operations. Furthermore, terms "comprise", "comprising", or any other variations thereof are intended to cover a non-exclusive inclusion, so that a process, a method, an article, or a device that comprises a series of elements not only comprises those elements, but also comprises other elements that are not explicitly listed, or further comprises inherent elements of the process, the method, the article, or the device. Without further limitation, an element defined by a sentence "comprising a . . . " does not exclude other same elements existing in a process, a method, an article, or a device that comprises the element.

In the illustration of the present disclosure, it should be noted that orientation or positional relationships indicated by terms such as "upper", "lower", "inner", "outer", etc. are orientation or positional relationships based on those as shown in the drawings, or based on orientation or positional relationships of a product of the present disclosure which is conventionally placed during use, and are only used to facilitate the illustration of the present invention and to simplify the illustration, rather than indicating or implying that an apparatus or element referred to must have a specific orientation, and be constructed and operated in the specific orientation, and therefore said terms cannot be understood as limiting the present disclosure.

In the illustration of the present disclosure, it should be noted that unless otherwise explicitly specified and limited, terms "provide/configure", "connect" should be understood broadly, and for example, may be fixed connection, and may also be detachable connection, or integral connection; may be mechanical connection, and may also be electrical connection; and may be direct connection, and may also be indirect connection by means of an intermediate medium, and may also be interior communication between two elements. For a person having ordinary skill in the art, specific meanings of the described terms in the present disclosure could be understood according to specific situations.

Hereinafter, some embodiments of the present disclosure will be described in detail in combination with the accompanying drawings. The following embodiments and features in the embodiments may be combined with one another without conflicts.

The embodiments of the present disclosure provide an electronic device, which may be an independent computer device, an Electronic Control Unit (ECU), and a battery management system. Please refer to FIG. 1, a schematic structural diagram of the electronic device is shown. The electronic device comprises a processor 10, a memory 11, and a bus 12. The processor 10 and the memory 11 are connected by the bus 12, and the processor 10 is used to execute one or more executable modules, such as one or more computer programs, stored in the memory 11.

The processor 10 may be an integrated circuit chip having signal processing capability. During implementation, the operations of the method for monitoring the parameter of the battery pack may be completed by an integrated logic circuit of hardware in the processor 10 or instructions in the form of software. The processor 10 may be a general-purpose processor, comprising a Central Processing Unit (CPU), a Network Processor (NP), and the like; and may also be a Digital Signal Processor (DSP), an Application Specific Integrated Circuit (ASIC), a Field-Programmable Gate Array (FPGA), or other programmable logic devices, a discrete gate or transistor logic device, or a discrete hardware assembly.

The memory 11 may comprise a high-speed Random Access Memory (RAM), and may also comprise a non-volatile memory, for example, at least one disk memory.

The bus 12 may be an Industry Standard Architecture (ISA) bus, a Peripheral Component Interconnect (PCI) bus, or an Extended Industry Standard Architecture (EISA) bus, or the like. Only one bidirectional arrow is shown in FIG. 1, but it does not represent that there is only one bus 12 or one type of buses 12.

The memory 11 is used to store a program, for example, a program corresponding to the apparatus for monitoring the parameter of the battery pack. The apparatus for monitoring the parameter of the battery pack comprises at least one software functional module which may be stored in the memory 11 in the form of software or firmware or solidified in an Operating System (OS) of the electronic device. Upon receiving an execution instruction, the processor 10 executes the program to implement the method for monitoring the parameter of the battery pack.

In some exemplary embodiments, the electronic device further comprises a communication interface 13. The communication interface 13 is connected to the processor 10 by the bus.

In some exemplary embodiments, the electronic device can be in communication connection with a Battery Management System (BMS) of the battery pack by the communication interface 13, so as to acquire data detected by the BMS.

It should be understood that the structure as shown in FIG. 1 is only a schematic structural diagram of a part of the electronic device. The electronic device may also comprise more or fewer assemblies than those shown in FIG. 1, or have different configurations from that shown in FIG. 1. The assemblies shown in FIG. 1 may be implemented in hardware, software, or a combination thereof.

The embodiments of the present disclosure provide a method for monitoring a parameter of a battery pack, which may be applied to, but is not limited to be applied to the electronic device as shown in FIG. 1. For a specific flow, please refer to FIG. 2. the method for monitoring the parameter of the battery pack comprises: S101, S102 and S103, which are specifically as described below.

At S101, a first pre-estimated resistance value corresponding to the battery pack at a t-th cycle is acquired based on a preset state estimation equation and an internal resistance value of the battery pack at a (t−1)-th cycle, wherein t represents the current number of cycles of the battery pack, the current number of cycles represents the number of charges and discharges cumulatively completed by the battery pack, and the preset state estimation equation represents a conversion relationship between the internal resistance value at the (t−1)-th cycle and the first pre-estimated resistance value, where t≥2.

In some exemplary embodiments, the preset state estimation equation is:

$$\hat{X}_t^- = F\hat{X}_{t-1}^- + w_t,$$

wherein $$\hat{X}_t^-$$

represents the first pre-estimated resistance value, $$\hat{X}_{t-1}^-$$

represents the internal resistance value at the (t−1)-th cycle, F represents a first preset coefficient matrix, and $w_t$ represents engineering noise. In some exemplary implementations, the engineering noise may be a compensation value which changes along with the number of cycles.

At S102, a second pre-estimated resistance value corresponding to the t-th cycle is determined based on a pre-configured mapping relationship, wherein the pre-configured mapping relationship represents a conversion relationship between t and the second pre-estimated resistance value.

In some exemplary embodiments, the pre-configured mapping relationship may be:

$$X_{measurement\ value} = f(\text{Temp, Number});$$

wherein $X_{measurement\ value}$ represents the second pre-estimated resistance value, f represents the pre-configured mapping relationship, Temp represents an adjustment constant corresponding to current temperature, and Number represents the number of cycles, i.e. being equal to t.

At S103, an internal resistance value of the battery pack at the t-th cycle is determined based on the first pre-estimated resistance value and the second pre-estimated resistance value.

Correction and optimization are performed based on combination of the first pre-estimated resistance value and the second pre-estimated resistance value so as to obtain an internal resistance value of the battery pack at the t-th cycle, thereby ensuring the accuracy of the finally obtained internal resistance value of the battery pack at the t-th cycle, so that the current state of the battery pack can be more clearly learned.

It should be noted that the battery pack in the embodiments of the present disclosure may be a cell, or may be formed by connecting a plurality of cells in parallel and/or in series.

In conclusion, by virtue of the solution provided in the embodiments of the present disclosure, correction and optimization are performed based on combination of the first pre-estimated resistance value and the second pre-estimated resistance value so as to obtain an internal resistance value of the battery pack at the t-th cycle, thereby ensuring the accuracy of the finally obtained internal resistance value of the battery pack at the t-th cycle, so that the current state of the battery pack can be more clearly learned.

Regarding how to acquire the pre-configured mapping relationship, the embodiments of the present disclosure further provide a possible implementation, please refer to the following content.

First, a cell with the same specification is used for experimental statistics, and data is recorded, so as to generate the mapping relationship. It should be noted that the experiment may be performed in a fixed temperature range.

An internal resistance value under each number of charge and discharge cycles is acquired by the following formula:

$$r = \frac{rVolH - rVolL}{rCurH - rCurL};$$

where rVolH is the voltage of high-rate discharge, rVolL is the voltage of low-rate discharge, rCurH is the current of the high-rate discharge, and rCurL is the current of the low-rate discharge.

The internal resistance value may be expressed by using the following formula:

$$f(\text{Temp, Num, SOC}).$$

The internal resistances of a cell under different States of Charge (SOC) and different temperatures are different, and are divided into a discharge internal resistance and a charge internal resistance. In other words, under a certain temperature, the mapping relationship between the internal resistance and the number of charge and discharge cycles is relevant to the current SOC, and the mapping relationship may be represented in a spatial coordinate system formed by three coordinates (internal resistance, the number of charge and discharge cycles and SOC). If the experiment is performed in the above manner, a large number of experiments are required, and a large amount of data needs to be acquired, which is adverse to experimental collection.

In order to overcome the problem of experimental difficulty, the embodiments of the present disclosure further provide a possible implementation, please refer to the following content.

After having completed a large number of experiments, the inventor has concluded and found that the internal resistance under SOC of 55%-85% is almost constant at the same temperature. On this basis, the mapping relationship can be simplified. After the simplification, under a certain temperature and when the SOC is in the range of 55%-85%, the mapping relationship may be represented in a plane coordinate system formed by two coordinates (internal resistance, and the number of charge and discharge cycles).

This is equivalent to reducing the order of three-dimensional coordinates in the spatial coordinate system to two-dimensional coordinates in the plane coordinate system, thereby greatly reducing the collection amount of data. It is only necessary to collect rVolH, rVolL, rCurH, and rCurL when the SOC is in the range of 55%-85%, for determining the internal resistance value.

The simplified mapping relationship may be:

$$X_{measurement\ value}=f(\text{Temp, Number}).$$

Figure 2:
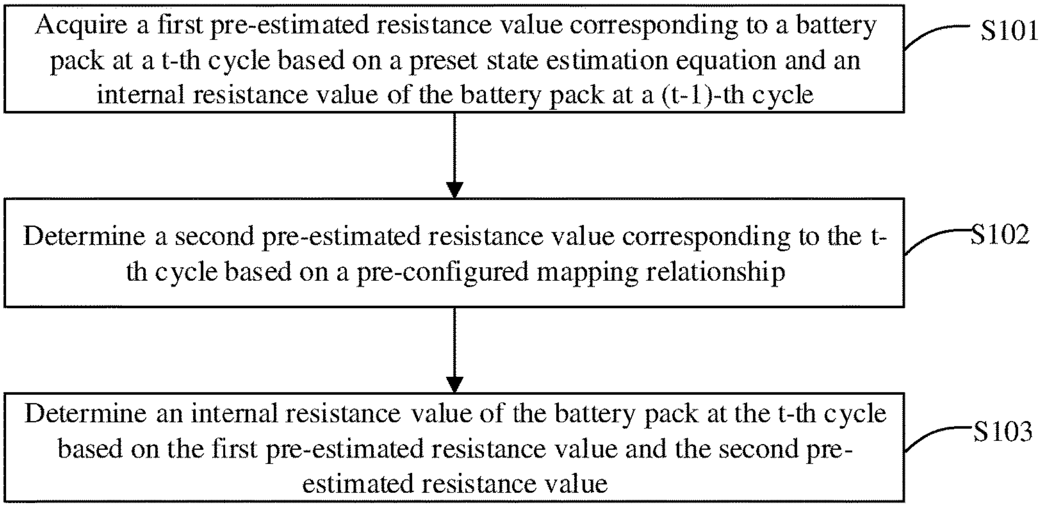
FIG. 2 is a schematic flowchart of a method for monitoring a parameter of a battery pack provided according to the embodiments of the present disclosure.
Figure 3:
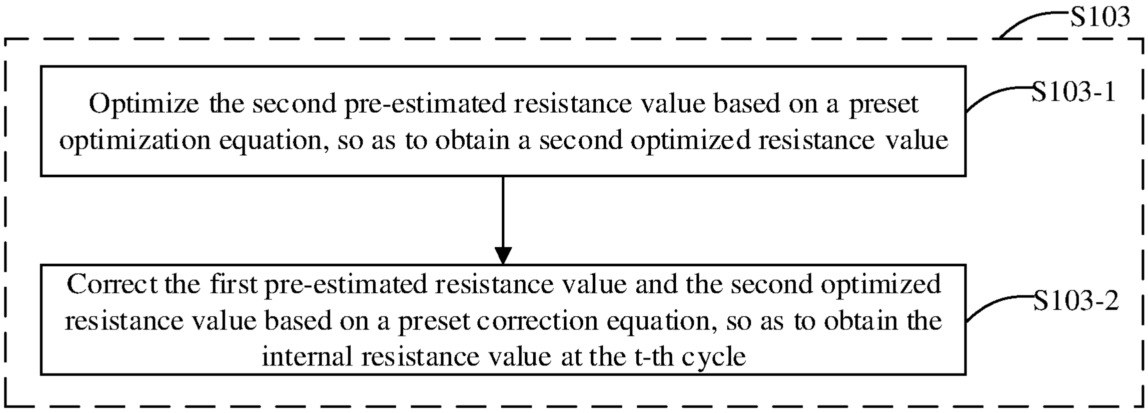
FIG. 3 is a schematic diagram of sub-operations of S103 provided according to the embodiments of the present disclosure.

Based on FIG. 2, for the operation in S103, the embodiments of the present disclosure further provide a possible implementation. Refer to FIG. 3, the operation S103 comprises: S103-1 and S103-2, which are specifically described as follows.

At S103-1, the second pre-estimated resistance value is optimized based on a preset optimization equation, so as to obtain a second optimized resistance value, wherein the preset optimization equation represents a conversion relationship between the second pre-estimated resistance value and the second optimized resistance value.

In some exemplary embodiments, the preset optimization equation is:

$$Z_t=HX_{measurement\ value}+\Delta P_t,$$

where $Z_t$ represents the second optimized resistance value corresponding to the t-th cycle, $X_{measurement\ value}$ represents the second pre-estimated resistance value corresponding to the t-th cycle, H represents a second preset coefficient matrix, and $\Delta P_t$ represents a measurement error.

At S103-2, the first pre-estimated resistance value and the second optimized resistance value are corrected based on a preset correction equation, so as to obtain the internal resistance value at the t-th cycle.

In some exemplary embodiments, the preset correction equation is:

$$\hat{X}_t=\hat{X}_t^-+K_t(Z_t-H\hat{X}_t^-),\ \text{where}\ K_t=\frac{P_{t-1}}{P_{t-1}+Q+R},$$

$\hat{X}_t$ represents the internal resistance value at the t-th cycle, $$\hat{X}_t^-$$

represents the first pre-estimated resistance value, $Z_t$ represents the second optimized resistance value, H represents the second preset coefficient matrix, $K_t$ represents a gain value at the t-th cycle, $P_{t-1}$ represents an error covariance correction value at the (t−1)-th cycle, and Q and R are covariance matrices of input and output measurement noises respectively.

Further, regarding how to determine $P_t$, the embodiments of the present disclosure further provide a possible implementation, and for details, please refer to the following content.

$$P_t^-=FP_{t-1}F^T+Q,$$

and $$P_t=(I-K_tH)P_t^-,$$

where I represents a correction value of the gain value at the t-th cycle.

Based on FIG. 2, regarding how to determine the internal short-circuit resistance, the embodiments of the present disclosure further provide a possible implementation. Please refer to FIG. 4, after S103, the method for monitoring the parameter of the battery pack may further comprise an operation S104, which is specifically described as follows.

At S104, an internal short-circuit resistance of the battery pack at the t-th cycle is determined based on the internal resistance value at the t-th cycle and a sum of an ohmic internal resistance and a polarity internal resistance of the battery pack at the t-th cycle.

Figure 5:
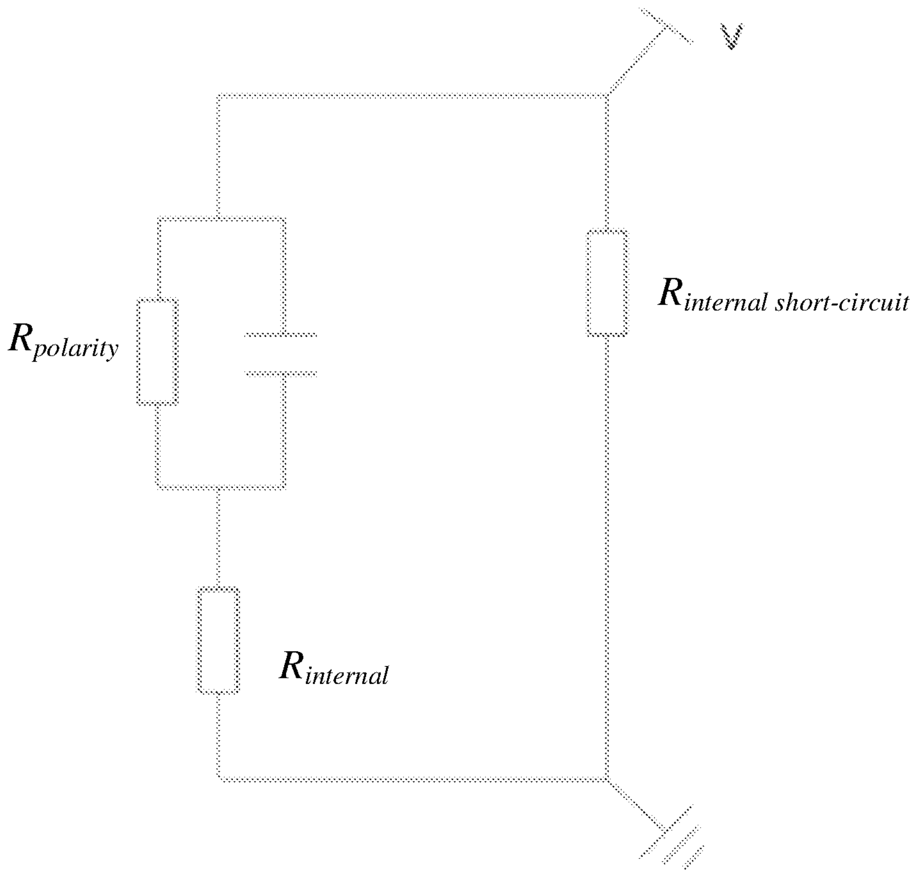
FIG. 5 is an equivalent circuit diagram of a battery pack provided according to the embodiments of the present disclosure.

In some exemplary embodiments, please refer to FIG. 5, FIG. 5 is an equivalent circuit diagram of a battery pack provided according to the embodiments of the present disclosure.

In some exemplary embodiments, the internal short-circuit resistance at the t-th cycle is expressed by:

$$R_{whole}R_{internal\ short-circuit}+R_{whole}R_{internal+polarity}=R_{internal+polarity}R_{internal\ short-circuit};$$

$$R_{internal\ short-circuit}(R_{internal+polarity}-R_{whole})=R_{whole}R_{internal+polarity};$$

-continued $$R_{internal\ short-circuit} = \frac{R_{whole}R_{internal+polarity}}{R_{internal+polarity} - R_{whole}} = \frac{R_{whole}}{1 - \frac{R_{whole}}{R_{internal+polarity}}};$$

where $R_{internal\ short-circuit}$ represents the internal short-circuit resistance at the t-th cycle, $R_{internal+polarity}$ represents the sum of the ohmic internal resistance and the polarity internal resistance at the t-th cycle, and $R_{whole}$ represents the internal resistance value at the t-th cycle, and is equal to $\hat{X}_t$. In some exemplary embodiments, $R_{internal+polarity}$ is equal to $X_{measurement\ value}$, and $R_{internal+polarity}$ may be equal to $R_{internal}+R_{polarity}$.

Figure 4:
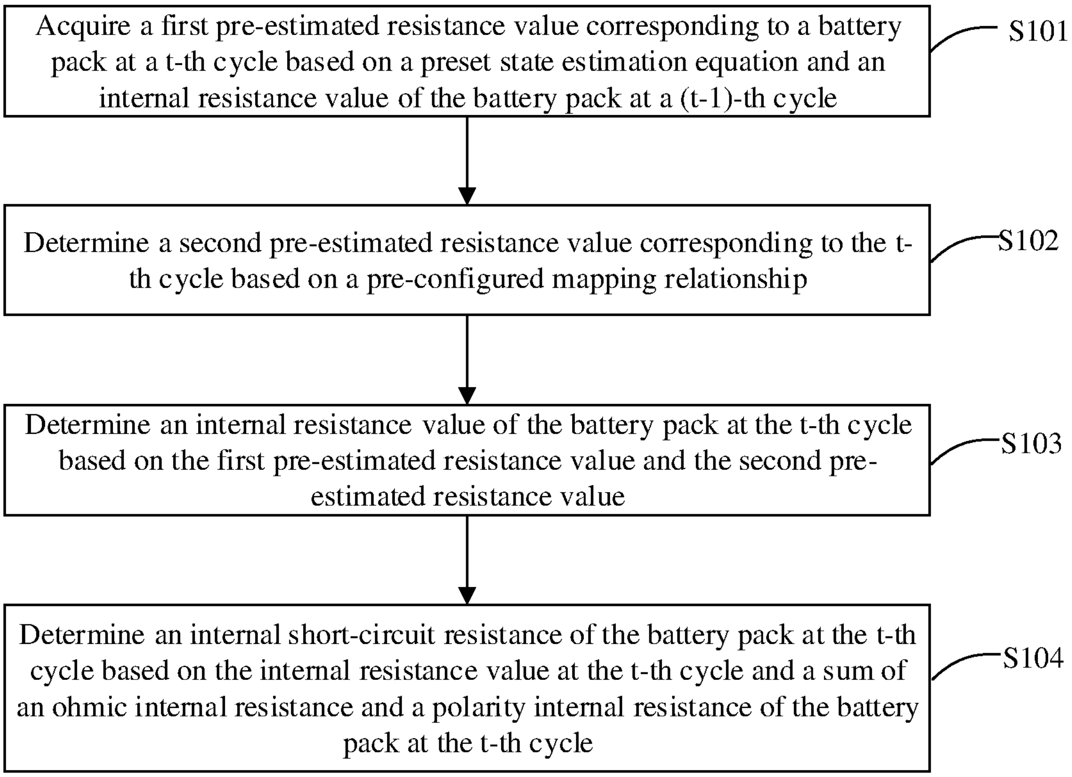
FIG. 4 is one of schematic flowcharts of a method for monitoring a parameter of a battery pack provided according to the embodiments of the present disclosure.
Figure 6:
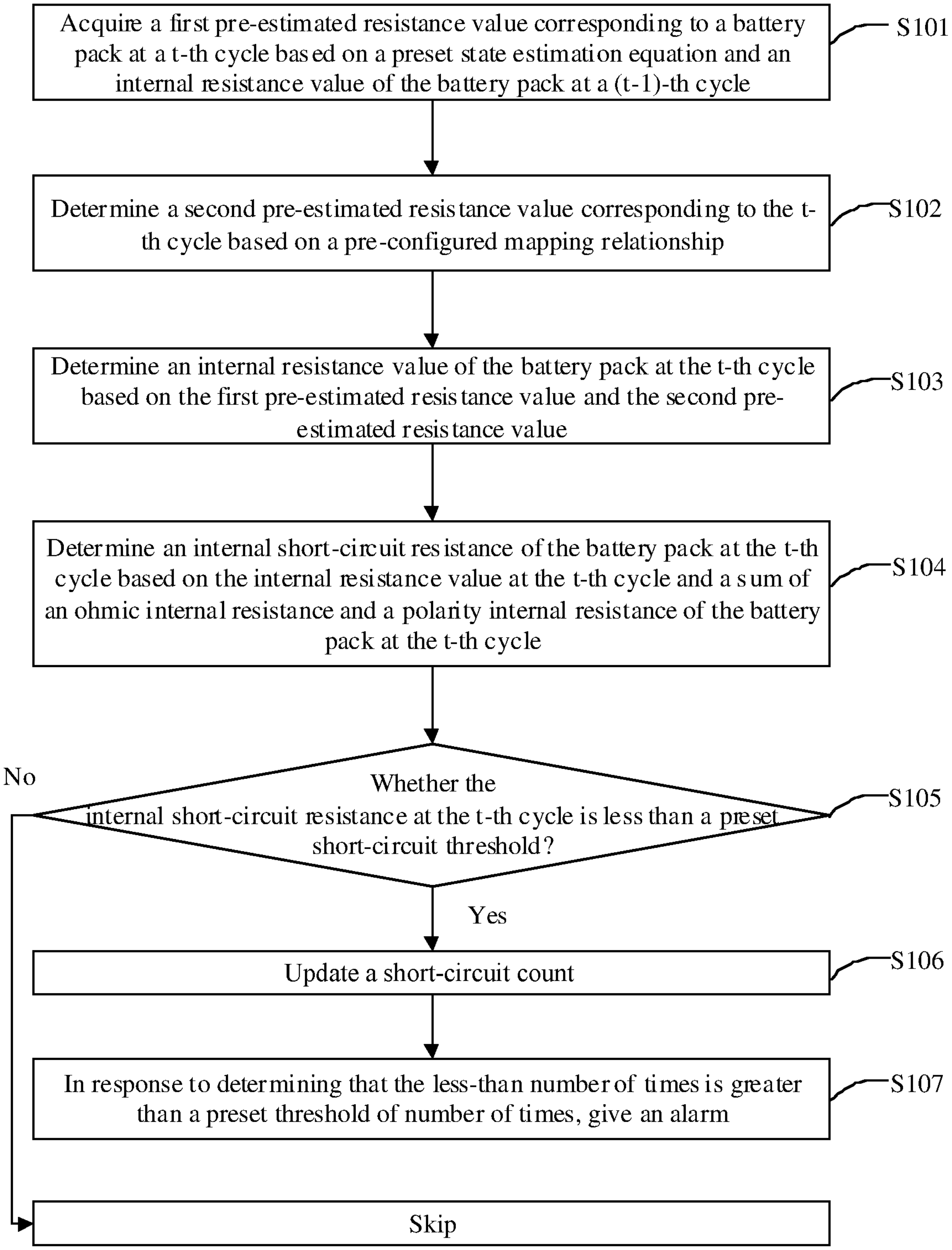
FIG. 6 is one of schematic flowcharts of a method for monitoring a parameter of a battery pack provided according to the embodiments of the present disclosure.

Based on FIG. 4, regarding how to monitor the safety state of the battery pack, the embodiments of the present disclosure further provide a possible implementation. Please refer to FIG. 6, after S104, the method for monitoring the parameter of the battery pack further comprises: S105, S106 and S107, which are specifically described as follows.

At S105, whether the internal short-circuit resistance at the t-th cycle is less than a preset short-circuit threshold is determined; if so, S106 is executed; and if not, the operations are skipped.

At S106, a short-circuit count is updated.

The short-circuit count is the number of times that the internal short-circuit resistance of the battery pack is less than the preset short-circuit threshold.

At S107, in response to determining that the short-circuit count is greater than a preset threshold of number of times, an alarm is given.

In some exemplary embodiments, a fire risk is notified by the alarm so as to prompt to eliminate hidden troubles in time, and ensure the safety of a device.

In some exemplary embodiments, if the short-circuit count is less than the preset threshold of number of times, or the internal short-circuit resistance at the t-th cycle is greater than or equal to the preset short-circuit threshold, the operations are skipped, waiting for a next cycle to perform acquisition again.

In some exemplary embodiments, the internal resistance is an internal resistance calculated at a charge state.

Figure 7:
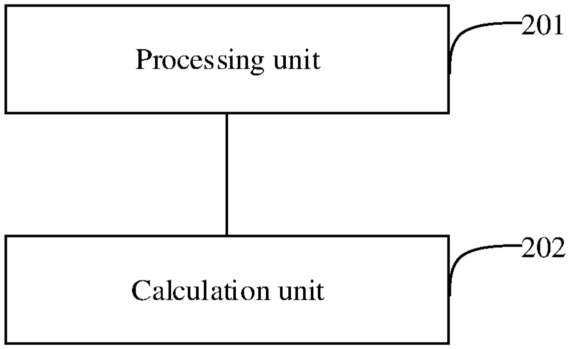
FIG. 7 is a schematic diagram of units of an apparatus for monitoring a parameter of a battery pack provided according to the embodiments of the present disclosure.

Please refer to FIG. 7, FIG. 7 relates to an apparatus for monitoring a parameter of a battery pack provided according to the embodiments of the present disclosure. As an exemplary implementation, the apparatus for monitoring the parameter of the battery pack is applied to the electronic device above.

The apparatus for monitoring the parameter of the battery pack comprises: a processing unit 201 and a calculation unit 202.

The processing unit 201 is configured to acquire a first pre-estimated resistance value corresponding to the battery pack at a t-th cycle based on a preset state estimation equation and an internal resistance value of the battery pack at a (t−1)-th cycle, wherein t represents the current number of cycles of the battery pack, the current number of cycles represents the number of charges and discharges cumulatively completed by the battery pack, and the preset state estimation equation represents a conversion relationship between the internal resistance value at the (t−1)-th cycle and the first pre-estimated resistance value, where t≥2;

the processing unit 201 is further configured to determine a second pre-estimated resistance value corresponding to the t-th cycle based on a pre-configured mapping relationship, wherein the pre-configured mapping relationship represents a conversion relationship between t and the second pre-estimated resistance value; and the calculation unit 202 is configured to determine an internal resistance value of the battery pack at the t-th cycle based on the first pre-estimated resistance value and the second pre-estimated resistance value.

In some exemplary embodiments, the processing unit 201 may execute S101, S102 and S104 to S107 described above, and the calculation unit 202 may execute S103 described above.

It should be noted that the apparatus for monitoring the parameter of the battery pack provided by the present embodiment can execute the method flow shown in the method flow embodiments above, so as to achieve the corresponding technical effects. For brevity of description, for parts not mentioned in the present embodiment, reference made be made to corresponding content in the embodiments above.

The embodiments of the present disclosure further provide a storage medium; the storage medium stores computer instructions and a program; and the computer instructions and the program, when being read and run, execute the method for monitoring the parameter of the battery pack of the embodiments above. The storage medium may comprise a memory, a flash memory, a register, a combination thereof, or the like.

Hereinafter, an electronic device is provided, which may be an independent computer device, an Electronic Control Unit (ECU), and a battery management system. The electronic device is as shown in FIG. 1, and can implement the described method for monitoring a parameter of a battery pack. Specifically, the electronic device comprises: a processor 10, a memory 11, and a bus 12. The processor 10 may be a CPU. The memory 11 is used to store one or more programs; and the one or more programs, when being executed by the processor 10, cause the processor 10 to execute the method for monitoring the parameter of the battery pack according to the embodiments above.

In the embodiments provided in the present disclosure, it should be understood that the disclosed apparatus and method may also be implemented in other manners. The apparatus embodiments as described above are merely exemplary. For example, the flowcharts and block diagrams in the accompanying drawings illustrate possible system architecture, functionality, and operation of apparatus, method and computer program product according to multiple embodiments of the present disclosure. In this regard, each block in the flowcharts or block diagrams may represent a part of a module, a program segment, or a code, and the part of a module, a program segment, or a code comprises one or more executable instructions for implementing a specified logic function. It should also be noted that in some alternative implementations, the functions labeled in the blocks may occur in sequences different from those labeled in the accompanying drawings. For example, two continuous blocks may, in fact, be executed substantially concurrently, or may sometimes be executed in an opposite order, depending on the functions involved. It will also be noted that each block in the block diagrams and/or flowcharts, and combinations of blocks in the block diagrams and/or flowcharts, can be implemented by special-purpose hardware-based systems that perform specified functions or actions, or implemented by combinations of special-purpose hardware and computer instructions.

In addition, each functional module in each embodiment of the present disclosure may be integrated together to form an independent part, or each module may exist separately, or two or more modules may be integrated to form an independent part.

If the function is implemented in the form of a software functional module and sold or used as an independent product, it may be stored in a computer-readable storage medium. Based on such understanding, the part of the technical solutions of the present disclosure that contributes in essence or to the related art or part of the technical solutions may be embodied in the form of a software product. The computer software product is stored in a storage medium and comprises several instructions to enable a computer device (which may be a personal computer, a server or a network device, etc.) to execute all or some of the operations of the method described in various embodiments of the present disclosure. Moreover, the storage medium above comprises: media such as a USB flash disk, a mobile hard disk, a Read-Only Memory (ROM), a Random Access Memory (RAM), a magnetic disk, or an optical disk, and the like which can store program codes.

The content above merely relates to preferred embodiments of the present disclosure, and is not intended to limit the present disclosure. For a person having ordinary skill in the art, the present disclosure may have various modifications and changes. Any modifications, equivalent replacements, improvements and the like made within the spirit and principle of the present disclosure shall all fall within the scope of protection of the present disclosure.

For a person having ordinary skill in the art, it would have been obvious that the present disclosure is not limited to the details of the described exemplary embodiments, and the present disclosure can be implemented in other specific forms without departing from the spirit or essential features of the present disclosure. Therefore, from any point of view, the embodiments shall be considered as exemplary, rather than restrictive. The scope of the present disclosure is defined by the appended claims rather than by the description above, and thus it is intended that all changes that fall within the meaning and range of equivalent elements of the claims are included in the present disclosure. Any reference signs in the claims shall not be considered as limiting the claims involved.

What is claimed is:

1. A method for preventing thermal runaway accidents of a lithium ion battery pack for an electric vehicle, wherein the method is performed by an Electronic Control Unit (ECU) of the electric vehicle, wherein the ECU is in communication connection with a Battery Management System (BMS) of the lithium ion battery pack by a communication interface, so as to acquire data of the lithium ion battery pack detected by the BMS, and the method comprises:

acquiring a first pre-estimated resistance value corresponding to the lithium ion battery pack at a t-th cycle based on a preset state estimation equation and an internal resistance value of the lithium ion battery pack at a (t−1)-th cycle, wherein t represents the current number of cycles of the lithium ion battery pack, the current number of cycles represents the number of charges and discharges cumulatively completed by the lithium ion battery pack, and the preset state estimation equation represents a conversion relationship between the internal resistance value at the (t−1)-th cycle and the first pre-estimated resistance value, where t≥2;

determining a second pre-estimated resistance value corresponding to the t-th cycle based on a pre-configured mapping relationship, wherein the pre-configured mapping relationship represents a conversion relationship between t and the second pre-estimated resistance value;

determining an internal resistance value of the lithium ion battery pack at the t-th cycle based on the first pre-estimated resistance value and the second pre-estimated resistance value;

determining an internal short-circuit resistance of the lithium ion battery pack at the t-th cycle based on the internal resistance value at the t-th cycle and a sum of an ohmic internal resistance and a polarity internal resistance of the lithium ion battery pack at the t-th cycle;

determining whether the internal short-circuit resistance at the t-th cycle is less than a preset short-circuit threshold;

in response to determining that the internal short-circuit resistance at the t-th cycle is less than the preset short-circuit threshold, updating a short-circuit count; wherein the short-circuit count is the number of times that the internal short-circuit resistance of the lithium ion battery pack is less than the preset short-circuit threshold; and in response to determining that the short-circuit count is greater than a preset threshold of number of times, causing maintenance to be performed on the lithium ion battery pack to prevent thermal runaway accidents and ensure safety of the lithium ion battery pack, wherein the preset state estimation equation is:

$$\hat{X}_t^- = F\hat{X}_{t-1}^- + w_t,$$

wherein $$\hat{X}_t^-$$

represents the first pre-estimated resistance value, $$\hat{X}_{t-1}^-$$

represents the internal resistance value at the (t−1)-th cycle, F represents a first preset coefficient matrix, and $w_t$ represents engineering noise;

determining the internal resistance value of the lithium ion battery pack at the t-th cycle based on the first pre-estimated resistance value and the second pre-estimated resistance value comprises:

optimizing the second pre-estimated resistance value based on a preset optimization equation, so as to obtain a second optimized resistance value, wherein the preset optimization equation represents a conversion relationship between the second pre-estimated resistance value and the second optimized resistance value; and correcting the first pre-estimated resistance value and the second optimized resistance value based on a preset correction equation, so as to obtain the internal resistance value at the t-th cycle;

wherein the preset optimization equation is:

$$Z_t = HX_{measurement\ value} + \Delta P_t,$$

where $Z_t$ represents the second optimized resistance value, $X_{measurement\ value}$ represents the second pre-estimated resistance value, H represents a second preset coefficient matrix, and $\Delta P_t$ represents a measurement error;

wherein the preset correction equation is:

$$\hat{X}_t = \hat{X}_t^- + K_t(Z_t - H\hat{X}_t^-), \text{ where } K_t = \frac{P_{t-1}}{P_{t-1} + Q + R},$$

$\hat{X}_t$ represents the internal resistance value at the t-th cycle, $$\hat{X}_t^-$$

represents the first pre-estimated resistance value, $Z_t$ represents the second optimized resistance value, H represents the second preset coefficient matrix, $K_t$ represents a gain value at the t-th cycle, $P_{t-1}$ represents an error covariance correction value at the (t−1)-th cycle, and Q and R are covariance matrices of input and output measurement noises respectively.

2. The method for monitoring the parameter of the lithium ion battery pack according to claim 1, wherein the engineering noise is a compensation value which changes along with the number of cycles.

3. The method for monitoring the parameter of the lithium ion battery pack according to claim 1, wherein $$P_t^- = FP_{t-1}F^T + Q, \text{ and } P_t = (I - K_tH)P_t^-,$$

where I represents a correction value of the gain value at the t-th cycle.

4. The method for monitoring the parameter of the lithium ion battery pack according to claim 1, wherein the internal short-circuit resistance at the t-th cycle is expressed by:

$$R_{internal\ short-circuit} = \frac{R_{whole}R_{internal+polarity}}{R_{internal+polarity} - R_{whole}} = \frac{R_{whole}}{1 - \frac{R_{whole}}{R_{internal+polarity}}},$$

where $R_{internal\ short-circuit}$ represents the internal short-circuit resistance at the t-th cycle, $R_{internal+polarity}$ represents the sum of the ohmic internal resistance and the polarity internal resistance at the t-th cycle, and $R_{whole}$ represents the internal resistance value at the t-th cycle.

5. The method for monitoring the parameter of the lithium ion battery pack according to claim 4, wherein $R_{internal+polarity}$ is equal to $X_{measurement\ value}$, and $R_{internal+polarity}$ is equal to $R_{internal}+R_{polarity}$.

6. The method for monitoring the parameter of the lithium ion battery pack according to claim 1, wherein the pre-configured mapping relationship is:

$$X_{measurement\ value} = f(\text{Temp, Number});$$

wherein $X_{measurement\ value}$ represents the second pre-estimated resistance value, f represents the pre-configured mapping relationship, Temp represents an adjustment constant corresponding to current temperature, and Number represents the number of cycles and is equal to t.

7. The method for monitoring the parameter of the lithium ion battery pack according to claim 1, wherein the internal resistance is an internal resistance calculated at a charge state.

8. An apparatus for preventing thermal runaway accidents of a lithium ion battery pack for an electric vehicle, wherein the apparatus is provided on an Electronic Control Unit (ECU) of the electric vehicle, wherein the ECU is in communication connection with a Battery Management System (BMS) of the lithium ion battery pack by a communication interface, so as to acquire data of the lithium ion battery pack detected by the BMS, and the apparatus comprises a processor and a memory, wherein the memory is used to store one or more programs, and the one or more programs, when being executed by the processor, cause the processor to execute following operations:

acquiring a first pre-estimated resistance value corresponding to the lithium ion battery pack at a t-th cycle based on a preset state estimation equation and an internal resistance value of the lithium ion battery pack at a (t−1)-th cycle, wherein t represents the current number of cycles of the lithium ion battery pack, the current number of cycles represents the number of charges and discharges cumulatively completed by the lithium ion battery pack, and the preset state estimation equation represents a conversion relationship between the internal resistance value at the (t−1)-th cycle and the first pre-estimated resistance value, where t≥2;

determining a second pre-estimated resistance value corresponding to the t-th cycle based on a pre-configured mapping relationship, wherein the pre-configured mapping relationship represents a conversion relationship between t and the second pre-estimated resistance value;

determining an internal resistance value of the lithium ion battery pack at the t-th cycle based on the first pre-estimated resistance value and the second pre-estimated resistance value;

determining an internal short-circuit resistance of the lithium ion battery pack at the t-th cycle based on the internal resistance value at the t-th cycle and a sum of an ohmic internal resistance and a polarity internal resistance of the lithium ion battery pack at the t-th cycle;

determining whether the internal short-circuit resistance at the t-th cycle is less than a preset short-circuit threshold;

in response to determining that the internal short-circuit resistance at the t-th cycle is less than the preset short-circuit threshold, updating a short-circuit count: wherein the short-circuit count is the number of times that the internal short-circuit resistance of the lithium ion battery pack is less than the preset short-circuit threshold; and in response to determining that the short-circuit count is greater than a preset threshold of number of times, causing maintenance to be performed on the lithium ion battery pack to prevent thermal runaway accidents and ensure safety of the lithium ion battery pack, wherein the preset state estimation equation is:

$$\hat{X}_t^- = F\hat{X}_{t-1}^- + w_t,$$

wherein $$\hat{X}_t^-$$

represents the first pre-estimated resistance value, $$\hat{X}_{t-1}^-$$

represents the internal resistance value at the (t−1)-th cycle, F represents a first preset coefficient matrix, and $w_t$ represents engineering noise;

determining the internal resistance value of the lithium ion battery pack at the t-th cycle based on the first pre-estimated resistance value and the second pre-estimated resistance value comprises:

optimizing the second pre-estimated resistance value based on a preset optimization equation, so as to obtain a second optimized resistance value, wherein the preset optimization equation represents a conversion relationship between the second pre-estimated resistance value and the second optimized resistance value; and correcting the first pre-estimated resistance value and the second optimized resistance value based on a preset correction equation, so as to obtain the internal resistance value at the t-th cycle;

wherein the preset optimization equation is:

$$Z_t = HX_{measurement\ value} + \Delta P_t,$$

where $Z_t$ represents the second optimized resistance value, $X_{measurement\ value}$ represents the second pre-estimated resistance value, H represents a second preset coefficient matrix, and $\Delta P_t$ represents a measurement error;

wherein the preset correction equation is:

$$\hat{X}_t = \hat{X}_t^- + K_t(Z_t - H\hat{X}_t^-), \text{ where}$$

$$K_t = \frac{P_{t-1}}{P_{t-1} + Q + R},$$

$\hat{X}_t$ represents the internal resistance value at the t-th cycle, $$\hat{X}_t^-$$

represents the first pre-estimated resistance value, $Z_t$ represents the second optimized resistance value, H represents the second preset coefficient matrix, $K_t$ represents a gain value at the t-th cycle, $P_{t-1}$ represents an error covariance correction value at the (t−1)-th cycle, and Q and R are covariance matrices of input and output measurement noises respectively.

9. The apparatus for monitoring the parameter of the lithium ion battery pack according to claim 8, wherein the lithium ion battery pack is a cell, or is formed by connecting a plurality of cells in parallel and/or in series.

10. The apparatus for monitoring the parameter of the lithium ion battery pack according to claim 8, wherein the engineering noise is a compensation value which changes along with the number of cycles.

11. The apparatus for monitoring the parameter of the lithium ion battery pack according to claim 8, wherein $$P_t^- = FP_{t-1}F^T + Q, \text{ and } P_t = (I - K_tH)P_t^-,$$

where I represents a correction value of the gain value at the t-th cycle.

12. The apparatus for monitoring the parameter of the lithium ion battery pack according to claim 8, wherein the internal short-circuit resistance at the t-th cycle is expressed by:

$$R_{internal\ short-circuit} = \frac{R_{whole}R_{internal+polarity}}{R_{internal+polarity} - R_{whole}} = \frac{R_{whole}}{1 - \frac{R_{whole}}{R_{internal+polarity}}},$$

where $R_{internal\ short-circuit}$ represents the internal short-circuit resistance at the t-th cycle, $R_{internal+polarity}$ represents the sum of the ohmic internal resistance and the polarity internal resistance at the t-th cycle, and $R_{whole}$ represents the internal resistance value at the t-th cycle.

13. The apparatus for monitoring the parameter of the lithium ion battery pack according to claim 12, wherein $R_{internal+polarity}$ is equal to $X_{measurement\ value}$, and $R_{internal+polarity}$ is equal to $R_{internal}+R_{polarity}$.

14. The apparatus for monitoring the parameter of the lithium ion battery pack according to claim 8, wherein the pre-configured mapping relationship is:

$$X_{measurement\ value} = f(\text{Temp, Number});$$

wherein $X_{measurement\ value}$ represents the second pre-estimated resistance value, f represents the pre-configured mapping relationship, Temp represents an adjustment constant corresponding to current temperature, and Number represents the number of cycles and is equal to t.

15. The apparatus for monitoring the parameter of the lithium ion battery pack according to claim 8, wherein the internal resistance is an internal resistance calculated at a charge state.

16. A non-transitory computer-readable storage medium, on which a computer program is stored, wherein when the computer program is executed by a processor of an Electronic Control Unit (ECU) of an electric vehicle, wherein the ECU is in communication connection with a Battery Management System (BMS) of a lithium ion battery pack of the electric vehicle by a communication interface, so as to acquire data of the lithium ion battery pack detected by the BMS, following operations are executed:

acquiring a first pre-estimated resistance value corresponding to the lithium ion battery pack at a t-th cycle based on a preset state estimation equation and an internal resistance value of the lithium ion battery pack at a (t−1)-th cycle, wherein t represents the current number of cycles of the lithium ion battery pack, the current number of cycles represents the number of charges and discharges cumulatively completed by the lithium ion battery pack, and the preset state estimation equation represents a conversion relationship between the internal resistance value at the (t−1)-th cycle and the first pre-estimated resistance value, where t≥2;

determining a second pre-estimated resistance value corresponding to the t-th cycle based on a pre-configured mapping relationship, wherein the pre-configured mapping relationship represents a conversion relationship between t and the second pre-estimated resistance value;

determining an internal resistance value of the lithium ion battery pack at the t-th cycle based on the first pre-estimated resistance value and the second pre-estimated resistance value;

determining an internal short-circuit resistance of the lithium ion battery pack at the t-th cycle based on the internal resistance value at the t-th cycle and a sum of an ohmic internal resistance and a polarity internal resistance of the lithium ion battery pack at the t-th cycle;

determining whether the internal short-circuit resistance at the t-th cycle is less than a preset short-circuit threshold;

in response to determining that the internal short-circuit resistance at the t-th cycle is less than the preset short-circuit threshold, updating a short-circuit count; wherein the short-circuit count is the number of times that the internal short-circuit resistance of the lithium ion battery pack is less than the preset short-circuit threshold; and in response to determining that the short-circuit count is greater than a preset threshold of number of times, causing maintenance to be performed on the lithium ion battery pack to prevent thermal runaway accidents and ensure safety of the lithium ion battery pack, wherein the preset state estimation equation is:

$$\hat{X}_t^- = F\hat{X}_{t-1}^- + w_t,$$

wherein $$\hat{X}_t^-$$

represents the first pre-estimated resistance value, $$\hat{X}_{t-1}^-$$

represents the internal resistance value at the (t−1)-th cycle, F represents a first preset coefficient matrix, and $w_t$ represents engineering noise;

determining the internal resistance value of the lithium ion battery pack at the t-th cycle based on the first pre-estimated resistance value and the second pre-estimated resistance value comprises:

optimizing the second pre-estimated resistance value based on a preset optimization equation, so as to obtain a second optimized resistance value, wherein the preset optimization equation represents a conversion relationship between the second pre-estimated resistance value and the second optimized resistance value; and correcting the first pre-estimated resistance value and the second optimized resistance value based on a preset correction equation, so as to obtain the internal resistance value at the t-th cycle;

wherein the preset optimization equation is:

$$Z_t = HX_{measurement\ value} + \Delta P_t,$$

where $Z_t$ represents the second optimized resistance value, $X_{measurement\ value}$ represents the second pre-estimated resistance value, H represents a second preset coefficient matrix, and $\Delta P_t$ represents a measurement error;

wherein the preset correction equation is:

$$\hat{X}_t = \hat{X}_t^- + K_t(Z_t - H\hat{X}_t^-), \text{ where } K_t = \frac{P_{t-1}}{P_{t-1} + Q + R},$$

$\hat{X}_t$ represents the internal resistance value at the t-th cycle, $$\hat{X}_t^-$$

represents the first pre-estimated resistance value, $Z_t$ represents the second optimized resistance value, H represents the second preset coefficient matrix, $K_t$ represents a gain value at the t-th cycle, $P_{t-1}$ represents an error covariance correction value at the (t−1)-th cycle, and Q and R are covariance matrices of input and output measurement noises respectively.

* * * * *